(12) United States Patent
Appaswamy et al.

(10) Patent No.: US 9,905,558 B1
(45) Date of Patent: Feb. 27, 2018

(54) CONDUCTIVITY MODULATED DRAIN EXTENDED MOSFET

(71) Applicant: Texas Instruments Incorporated, Dallas, TX (US)

(72) Inventors: Aravind C Appaswamy, Plano, TX (US); James P. Di Sarro, Plano, TX (US); Farzan Farbiz, Royal Oak, MI (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/387,992

(22) Filed: Dec. 22, 2016

(51) Int. Cl.
*H01L 27/07* (2006.01)
*H01L 29/739* (2006.01)
*H01L 29/49* (2006.01)

(52) U.S. Cl.
CPC ...... *H01L 27/0722* (2013.01); *H01L 27/0705* (2013.01); *H01L 27/0711* (2013.01); *H01L 29/4916* (2013.01); *H01L 29/7393* (2013.01)

(58) Field of Classification Search
CPC ............. H01L 27/0722; H01L 27/0711; H01L 27/0705; H01L 29/7393
See application file for complete search history.

(56) References Cited

U.S. PATENT DOCUMENTS

| 5,343,052 A | 8/1994 | Oohata et al. | |
|---|---|---|---|
| 5,436,486 A * | 7/1995 | Fujishima | H01L 29/1087 257/140 |
| 5,801,420 A * | 9/1998 | Fujishima | H01L 29/0634 257/133 |
| 5,869,850 A * | 2/1999 | Endo | H01L 29/0696 257/139 |
| 7,723,802 B2 * | 5/2010 | Terashima | H01L 27/0647 257/378 |
| 2010/0171149 A1* | 7/2010 | Denison | H01L 29/7436 257/173 |
| 2011/0291157 A1* | 12/2011 | Takahashi | H01L 29/0696 257/144 |
| 2013/0153956 A1* | 6/2013 | Shi | H01L 21/743 257/140 |
| 2014/0210003 A1* | 7/2014 | Ko | H01L 27/0629 257/337 |

OTHER PUBLICATIONS

Jong Mun Park, "Novel Power Devices for Smart Power Applications", Dissertation, available at http://www.iue.tuwien.ac.at/phd/park/diss.html, Oct. 28, 2004, pp. 1-4, section 2.2.2.
"Insulated-gate Bipolar Transistor", Wikipedia, available at https://en.wikipedia.org/wiki/Insulated-gate_bipolar_transistor, Sep. 5, 2016, pp. 1-2.

* cited by examiner

*Primary Examiner* — Asok K Sarkar
*Assistant Examiner* — Grant Withers
(74) *Attorney, Agent, or Firm* — Tuenlap D. Chan; Charles A. Brill; Frank D. Cimino (57) ABSTRACT

An integrated circuit is fabricated on a semiconductor substrate. An insulated gate bipolar transistor (IGBT) is formed upon the semiconductor substrate in which the IGBT has an anode terminal, a cathode terminal, and a gate terminal, and a drift region. A diode is also formed on the semiconductor substrate and has an anode terminal and a cathode terminal, in which the anode of the diode is coupled to the anode terminal of the IGBT and the cathode of the diode is coupled to the drift region of the IGBT.

8 Claims, 9 Drawing Sheets

CONDUCTIVITY MODULATED DRAIN EXTENDED MOSFET

TECHNICAL FIELD OF THE DISCLOSURE

This disclosure relates drain extended MOSFETS, and in particular to insulated-gate bipolar transistors.

BACKGROUND

An insulated-gate bipolar transistor (IGBT) is a three-terminal power semiconductor device primarily used as an electronic switch. It combines high efficiency and fast switching. IGBTs switch electric power in many modern appliances: variable-frequency drives (VFDs), electric cars, trains, variable speed refrigerators, lamp ballasts, air-conditioners, and even stereo systems with switching amplifiers, etc. Since it is designed to turn on and off rapidly, amplifiers that use it often synthesize complex waveforms with pulse-width modulation and low-pass filters. In switching applications, modern devices feature pulse repetition rates well into the ultrasonic range-frequencies which are at least ten times the highest audio frequency handled by the device when used as an analog audio amplifier.

The IGBT combines the simple gate-drive characteristics of a metal oxide semiconductor field effect transistor (MOSFET) with the high-current and low-saturation-voltage capability of a bipolar transistor. The IGBT combines an isolated-gate FET for the control input and a bipolar power transistor as a switch in a single device. Large IGBT modules typically include many devices in parallel and can have very high current-handling capabilities in the order of hundreds of amperes with blocking voltages of 6000 V. These IGBTs can control loads of hundreds of kilowatts.

Various structures for IGBTs, such as: planar IGBTs, trench IGBTs, and lateral IGBTs, have been designed to customize the operational properties of the device for particular applications. For example, planar or vertical IGBTs utilize a convenient structure for a high power (e.g., high voltage and high current) switch. The planar IGBT includes a collector at a bottom side, a gate at a top side, and an emitter surrounding the gate at the top side. Trench gate IGBTs have a similar general structure to the planar IGBTs. However, trench IGBTs include a trench within which the gate is situated. The trench reduces the on-state voltage drop of the device. The current path of planar and trench IGBTs is vertical from the collector to the emitter.

Lateral IGBTs (LIGBT) are often employed in lower power control and detection circuits. Lateral IGBTs do not utilize the vertical structure of the planar and trench IGBTs, where collector and emitter contacts are provided on the top and on the bottom of the semiconductor material. Instead, lateral IGBTs generally include a substrate contact at a bottom side, a collector at one side of a top side, an emitter at the other side of the top side, and a gate disposed between the emitter and the collector at the top side. The current path of lateral IGBTs is horizontal (e.g., lateral) within the device from the collector to the emitter.

BRIEF DESCRIPTION OF THE DRAWINGS

Particular embodiments in accordance with the disclosure will now be described, by way of example only, and with reference to the accompanying drawings.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Drain extended MOS devices may show compression in the output characteristics at low drain currents due to high injection effects in the drain extension regions. Drain extended devices may have limited saturated drain current (IDSAT) due to the low doping in the drain extension. The drain extension region also affects die size for large current drivers. An IGBT device may enhance the ON-current of the drain extended devices by injecting minority carriers into the drain extension region by introducing a p+ region into the drain extension. Conductivity modulation may be obtained by effectively using the p+ region in the drain extension as the drain. Experiments have demonstrated a 3× improvement in IDSAT using this configuration.

A lateral IGBT construction is disclosed herein that allows for independently improving the inherent diode for performance optimization. Another embodiment allows for adjusting the injection levels and PNP gain for improving safe operating area (SOA). In another embodiment, robustness against SCR (silicon controlled rectifier) action may be provided by controlling the amount of minority carrier injection into the drain extension region. In effect, the gain of the pnp portion of the IGBT may be reduced in order to inhibit SCR action and allow safe operation over a wider range of voltage and current.

The solution is highly area efficient and widely applicable. Embodiments of this disclosure may provide smaller devices, particularly with regards to electro-static discharge (ESD) circuits.

Figure 1:
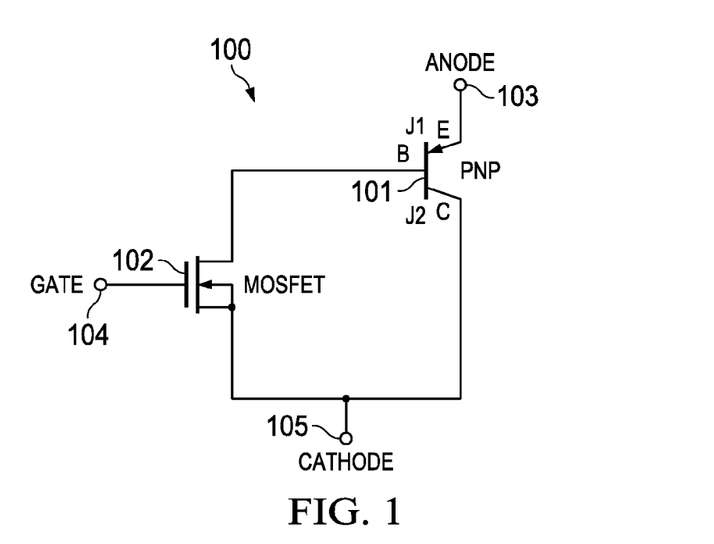
FIG. 1 is a schematic of an IGBT.

FIG. 1 is a schematic of a well known IGBT 100. The general operation of an IGBT is well known and need not be described in detail herein, see, for example: "Novel Power Devices for Smart Power Applications," Jong Mun Park, 2004. A brief description will be included herein in order to explain the improvements disclosed herein. A major limitation of a laterally diffused MOSFET (LDMOSFET) is their relatively high specific on-resistance (Rsp) due to the majority carrier conduction mechanism. The IGBT is a relatively new power device which is designed to overcome the high on-state loss of power MOSFETs. The device is essentially a combination of a pnp bipolar structure 101 which provides high current handling capability, and an n-channel MOSFET 102 which gives a high-impedance voltage control over the bipolar base current. It can be fabricated as either a high-power discrete vertical IGBT or a low-power lateral IGBT (LIGBT). LIGBTs may be integrated together with low voltage control circuitry on a single integrated circuit.

The structure of LIGBT 100 is similar to that of an LDMOSFET in that the gate is also formed by double diffusion. The main difference between an LIGBT structure and an LDMOSFET is that the LIGBT has a p+ anode 103 instead of the n+ drain of an LDMOSFET. In this structure, current flow cannot occur when a negative voltage is applied to the anode with respect to the cathode 105, because the emitter junction J1 becomes reverse biased. Emitter junction J1 is the junction between emitter anode (E) and the n-buffer base region (B). This provides the device with its reverse blocking state, and the depletion region extends in the n-drift region. When a positive voltage is applied to the anode 103 with the gate shorted to the cathode, a collector junction J2 (n-drift and p-well junction) becomes reverse biased and the device operates in its forward blocking state. Generally, the substrate is electrically connected to the source contact. When a positive gate voltage above the threshold voltage is applied to gate 104 with respect to the cathode (source) 105, an inversion channel is formed that connects the n+ cathode 105 to the n drift region. This creates the base current of the lateral pnp structure 101 in the LIGBT structure. If a positive voltage is applied between the p+ anode 103 and cathode 105, most of the voltage drops across J1, until the junction becomes forward biased. Under forward bias any additional increase in voltage drops across the channel and the drift region. The holes from the anode are injected into the n drift region and electrons flow into the drift region from the source through the channel. Because of the injected electrons and holes, the n drift region becomes conductivity modulated. With further increase in the anode voltage, more voltage drops across the inversion channel and the electron current increases to compensate for the increased hole current. If the hole concentration exceeds the background doping level of the n drift region, the device characteristics are similar to those of a forward biased pin diode. As a result, it can be operated at a higher current density compared to conventional LDMOSFETs.

If the inversion layer conductivity is reduced by the gate bias close to the threshold voltage, a significant voltage drop occurs across the channel. When this voltage drop becomes comparable to the difference between the gate bias and the threshold voltage, the channel is pinched-off. At this point, the electron current saturates. As a result, the device operates with current saturation in its active region with a gate controlled output current. In order to switch off the device, it is necessary to discharge the gate by shorting it to the cathode.

When the gate to cathode voltage is reduced to zero, the device is switched from its on-state to off-state; the current will fall to a fraction of the steady state value due to the cut-off of the electron current.

LIGBTs are susceptible to latch-up in the same way as discrete IGBTs because of an inherent parasitic pnpn thyristor in the device. At high current levels, the voltage drop across the cathode-body junction is sufficient to turn the parasitic npn structure on. The collector current of the npn structure forms the base current for the lateral pnp structure. When the sum of the current gains of the two structures reaches unity, latch-up occurs and gate control is lost. A known method to suppress latch-up is aimed at lowering the gain of the npn structure by using a p+ buried layer and a deep p+ sinker together with the n buffer layer at the cathode region. This n buffer can help to reduce charge injection by controlling the emitter efficiency of the device.

Figure 2:
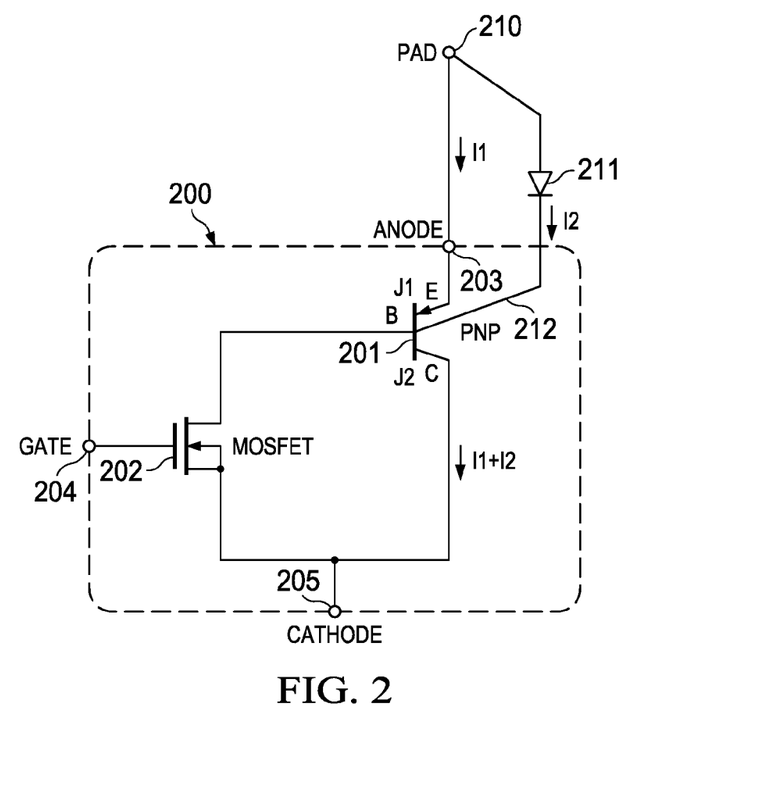
FIGS. 2-5 are top views and cross sections of embodiments of an LIGBT with a n+ injection region in the anode.

FIG. 2 is a schematic of an embodiment of an LIGBT 200 with an n+ injection region in the anode. LIGBT 200 is similar to LIGBT 100 of FIG. 1. LIGBT 200 is essentially a combination of a pnp bipolar structure 201 which provides high current handling capability, and an n-channel MOSFET 202 which gives a high-impedance voltage control over the bipolar base current. Current flow cannot occur when a negative voltage is applied to the anode 203 with respect to the cathode 205, because the emitter junction J1 becomes reverse biased. Emitter junction J1 is the junction between emitter anode (E) and the n-buffer base region (B). A control voltage applied to gate 204 controls current flow through LIGBT 200 in a similar manner as described with reference to FIG. 1 for LIGBT 100.

A problem with LIGBTs is that current flow may be limited by the voltage drop across intrinsic diode J1. In this case, it may be desirable to increase the size of the J1 diode, but this would in turn increase the size of the entire LIGBT 200. In this embodiment, an n+ region is added to the drain region to allow a contact point 212 for an additional external diode 211 that may be added essentially in parallel with intrinsic diode J1. The other end of diode 211 may be coupled to a pad 210 that is also coupled to anode 203. Pad 210 may then be coupled to a supply voltage, for example.

Diode 211 may be sized to handle a portion of a load current, in which case a portion 11 flows through the anode 203 and intrinsic junction J1 and a portion 12 flows through external diode 211. Total voltage drop across the two parallel diodes is less because current density is lower.

Figure 3:
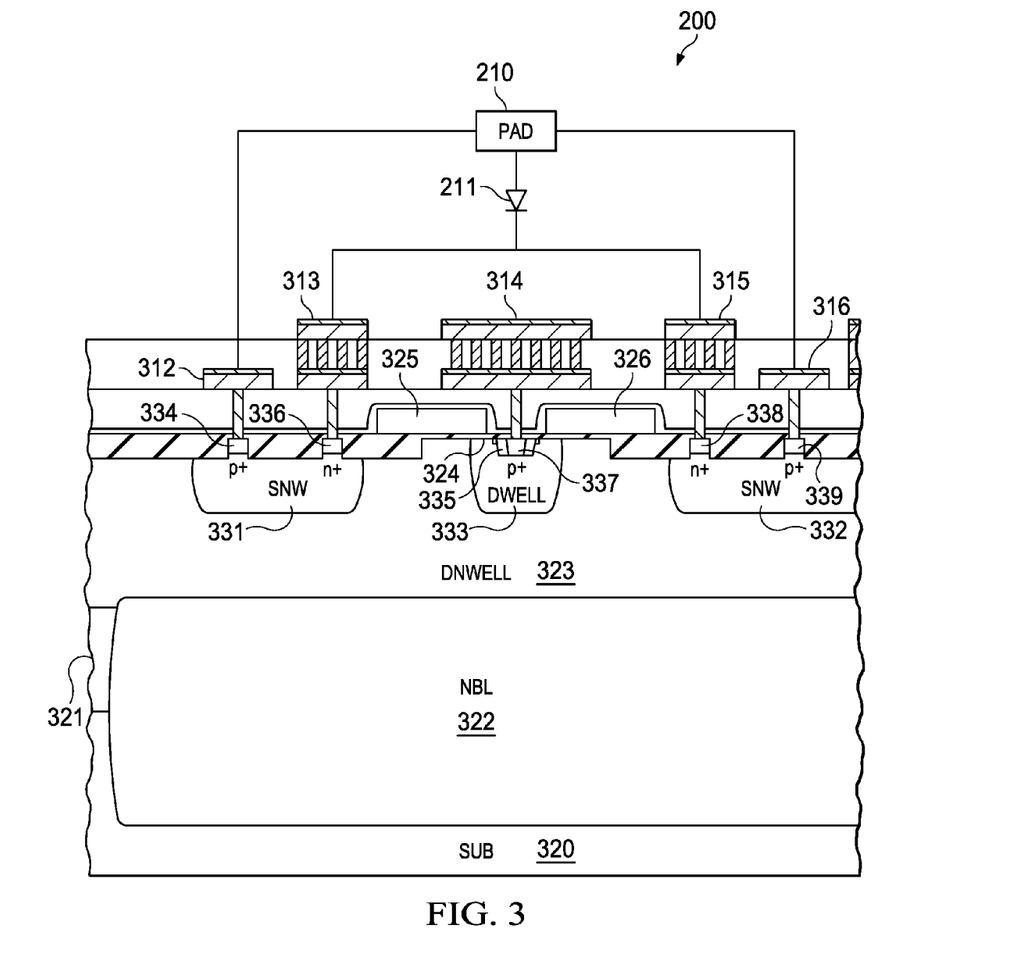

FIG. 3 is a cross sectional view of LIGBT 200. Semiconductor substrate 320 may be derived from a silicon wafer, for example. The growing and processing of silicon wafers is well known, so only a brief summary will be provided herein. An epitaxial ("epi") layer 321 may be grown across the top surface of substrate 321. Epi layer 321 and substrate 320 are typically doped to be p-type, with a dopant concentration typically in a range of 1E16-5E17/cm3. A buried n-type layer 322 may be implanted in epi 321. A deep n-type well (dnwell) 323 may be formed in epi 321 by diffusion or implantation, for example. Dnwell 323 forms the drain extension region for LIGBT 200. Dnwell 323 is a part of the drift region consistent with the above description. Alternatively, the epi layer 321 may be doped n-type and function as the drain extension for LIGBT 200. A heavier doped shallow nwell (SNW) 331 may be formed in dnwell 323 to form the drain region. SNW 331 may also be a part of the drift region consistent with the above description. P+ region 334 is formed in SNW 331 and it may serve as the anode 203, referring back to FIG. 2. P+ region 334 may be doped at a concentration of greater than 1E19/cm3, for example. SNW 331 may be doped at a concentration of approximately 3-5E17/cm3, for example. Deep n-type well 323 may be doped at a concentration of approximately 1-2E16/cm3, for example. Double diffused well (dwell) 333 is a p-type diffusion and may be doped at a concentration of approximately 1E18, for example. N-type region 335 is formed within dwell 333 and may serve as the source region for the MOS structure 202, referring back to FIG. 2. P+ type contact region 337 is formed in n-type region 335 and in contact with p-type dwell 333 and it may serve as the cathode 205, referring back to FIG. 2. P+ region 334 may also serve as an emitter, whereas the n-type region 331 and n-type extension region 323 may act as a base, and whereas p-type dwell 333 may serve as a collector to form pnp structure 201, referring back to FIG. 2. P+ region 334 and n-type region 331 form intrinsic diode junction J1, referring back to FIG. 1. A channel region 324 lies between drain extension region 323 and source region 335 and is covered by a thin gate oxide. Polysilicon gate structure 325 is formed over channel region 324 to form MOSFET 202, referring back to FIG. 2.

In this example, LIGBT 200 is a double sided device, in that there is a second SNW drain 332 with p+ anode 339 formed in dnwell 323 as another parallel drain. Polysilicon gate structure 326 may be a mirror image of gate 325.

In this embodiment, an n+ contact 336, 338 is provided in drain/base regions 331, 332 to allow an external diode 211 to be coupled to pad 210 in parallel with the intrinsic emitter junction J1, as discussed above with regard to FIG. 2. N+ contact 336, 338 may be doped at a concentration of greater than 1E19/cm$^3$, for example.

Figure 4:
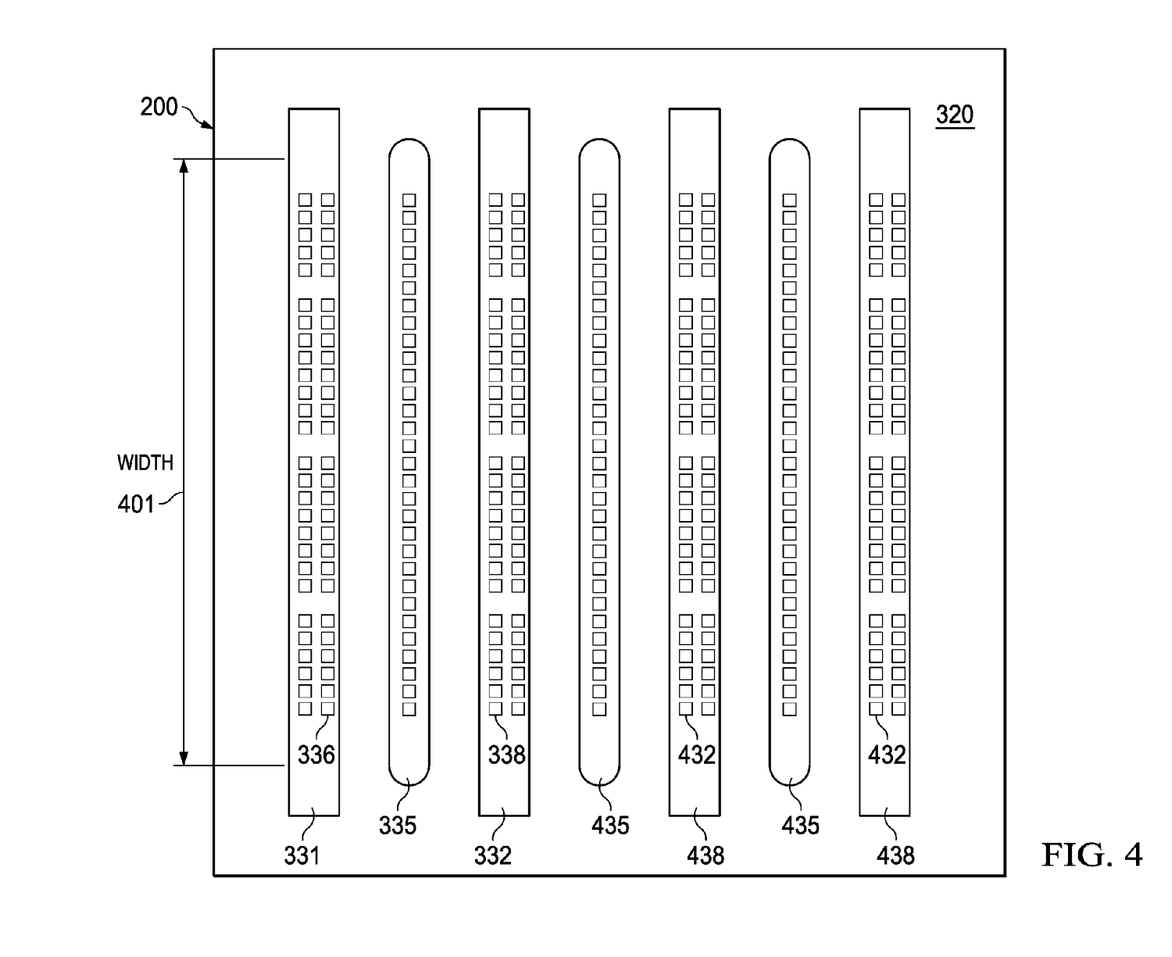

FIG. 4 is a top view of an example multi-finger LIGBT transistor 200. In this example, metal interconnect layers have been removed in order to more clearly see an aspect of the underlying structure. A first finger of transistor 200 includes a source region stripe 335 and a substantially parallel drain region stripe 331 with p+ anode region 334 (see FIG. 3) that lie within semiconductor substrate material 320. In this example, a second substantially parallel drain region stripe 332 with p+ anode region 339 (see FIG. 3) shares source region stripe 335 In some embodiments, there may be only one finger that may include only one source region stripe 335 and one drain region stripe 331, for example. In other embodiments, there may be only one finger that may include only one source region stripe 335 and two drain region stripes 331, 332, for example. In yet other embodiments, there may be multiple fingers in which additional substantially parallel source region stripes 435 and drain region stripes 439 are included. In the case of multiple source and drain region stripes, conductive interconnects may be used to connect the drain region stripes 331, 332, 439, etc in parallel and to connect the source region stripes 335, 435, etc in parallel to form a single transistor with multiple parallel fingers. The conductive interconnects may be metallic, for example. In other embodiments, the conductive interconnects may be polysilicon, silicide, or other known or later developed conductive interconnect materials. Semiconductor substrate material 320 is typically silicon; however other embodiments of the disclosure may be applied to other semiconductor materials, such as germanium, etc.

A channel region stripe is located substantially parallel to and between each of the source region stripes and the drain region stripes. Each channel region has a width 401, and the total effective channel width of device 200 is the sum of the widths of all of the channel regions of all of the fingers.

As described above with regard to FIG. 2, a set of n+ contacts 336, 338 may be provided in each drain region 331, 332, 432 to allow coupling to an external diode, such as diode 211 of FIG. 2.

Figure 5:
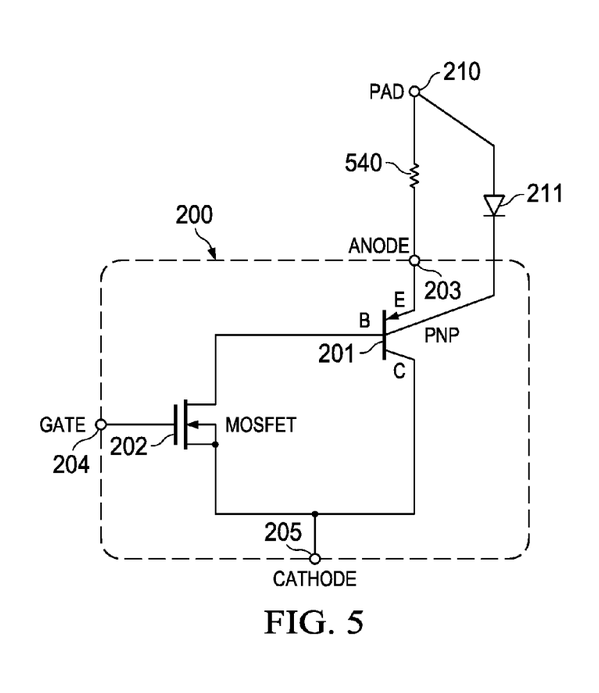

FIG. 5 is a schematic of another embodiment in which LIGBT 200 has a resistor 540 coupled in series with anode 203. Resistor 540 may allow a reduction in SCR latching action and therefore allow safe operation over a wider range of voltage and current. As mentioned with regard to FIG. 1, one way to reduce SCR action is to provide heavy p-type doping in the source region dwell. In this embodiment, resistor 540 allows a reduction in the current that flows through anode 203 and that contributes to SCR action. This current reduction may be compensated by an extra current that is allowed to flow through external diode 211 that does not contribute to SCR action. Resistor 540 may be implemented using known integrated circuit fabrication techniques, such as an element using a bulk resistance of a doped semiconductor region, a polysilicon element, an MOS device biased in the ohmic region, a metallic element, etc.

Figure 6:
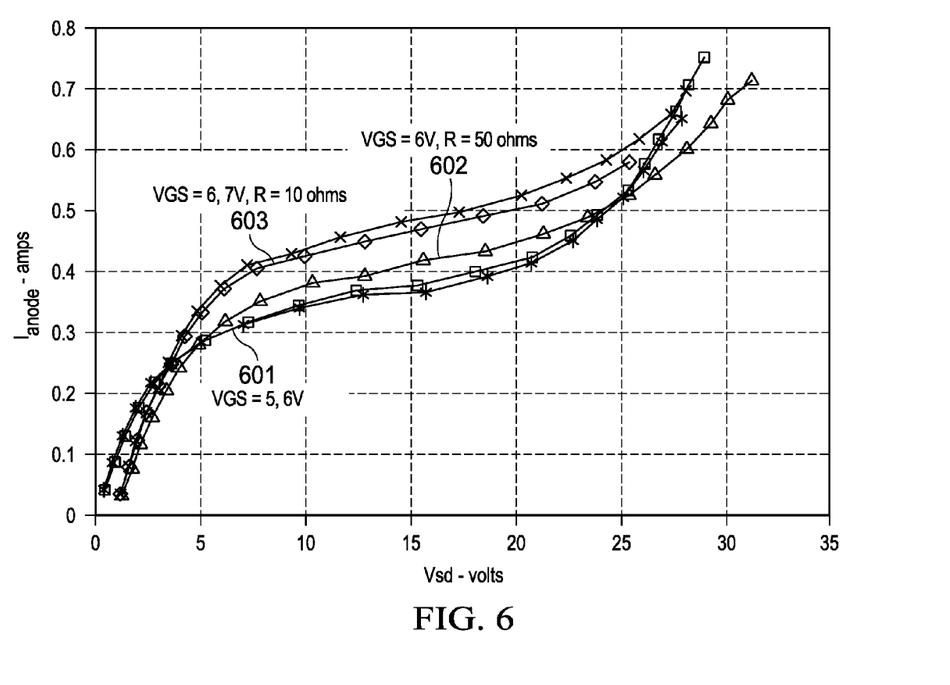
FIG. 6 is a plot illustrating improvements in saturation current flow through the LIGBT of FIG. 5.

FIG. 6 is a plot illustrating improvements in current flow through LIGBT 200 of FIG. 5. In this example, the term "anode current" includes both the current that flows through anode contact 203 and the current that flows through second diode 211. Plot lines 601 illustrate anode current $I_{anode}$ for gate to source voltages of 5v and 6v, but with no resistor 540. Plot line 602 illustrates anode current Idrain for gate to source voltages of 6v with a 50 ohm resistor 540. Plot lines 603 illustrate anode current Idrain for gate to source voltages of 6v and 7v with a 10 ohm resistor 540. Plot lines 603 illustrate approximately a 30% increase in anode saturation current over plot lines 601.

Figure 7:
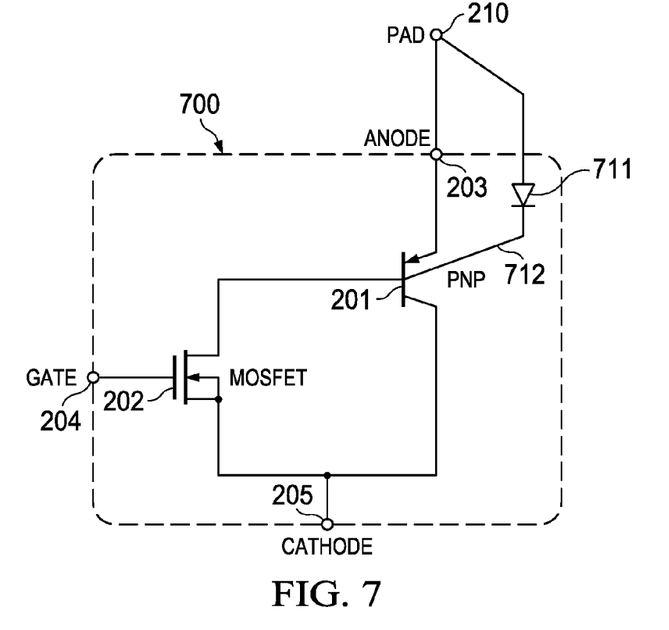
FIGS. 7-9 illustrate a schematic, a top view, and a cross sectional view of another embodiment of an LIGBT with a p+ injection region.

FIG. 7 is a schematic of an embodiment of an LIGBT 700 with a p+ injection region 712 in a deep n-type ring that surrounds LIGBT 700. In this case, second diode 711 may be included as part of LIGBT 700. This approach may require less space than using a separate diode; however, this embodiment may not be amenable to using a resistor in series with the anode to reduce SCR action, as described above in FIG. 5.

Figure 8:
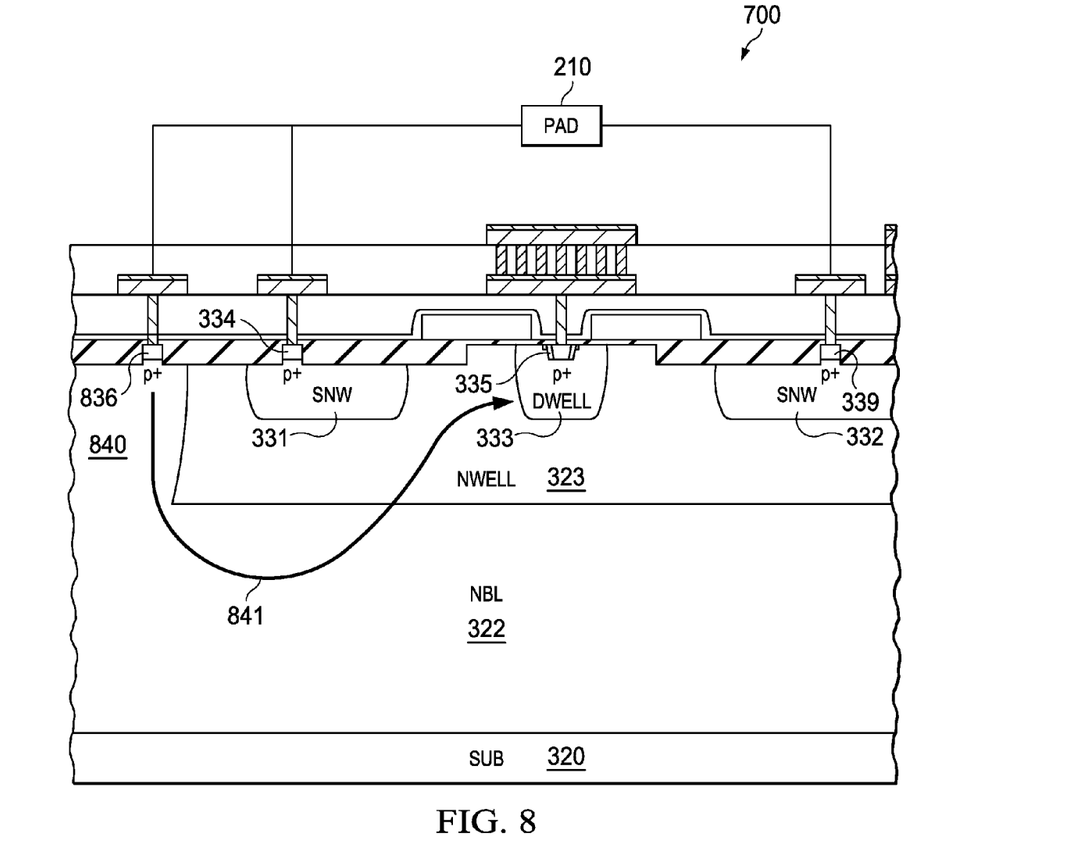

FIG. 8 is a cross sectional view of LIGBT 700. In this embodiment, the n+ contact regions may be removed from drift/base region 331, 332. A heavily doped deep n-type ring 840 may be implemented that goes down and joins buried n layer 321. Deep n ring 840 may surround LIGBT 700, for example. A p+ contact 836 is then formed in deep n ring 840 and may be coupled to pad 210, for example. In this manner, second diode 711 is formed by the junction of p+ 836 and heavily doped deep n ring 840.

In this case, current 841 may be injected into deep n ring 840, flow down to buried n layer 321, then flow up into drain/base region 331 and then to source/cathode 335.

Figure 9:
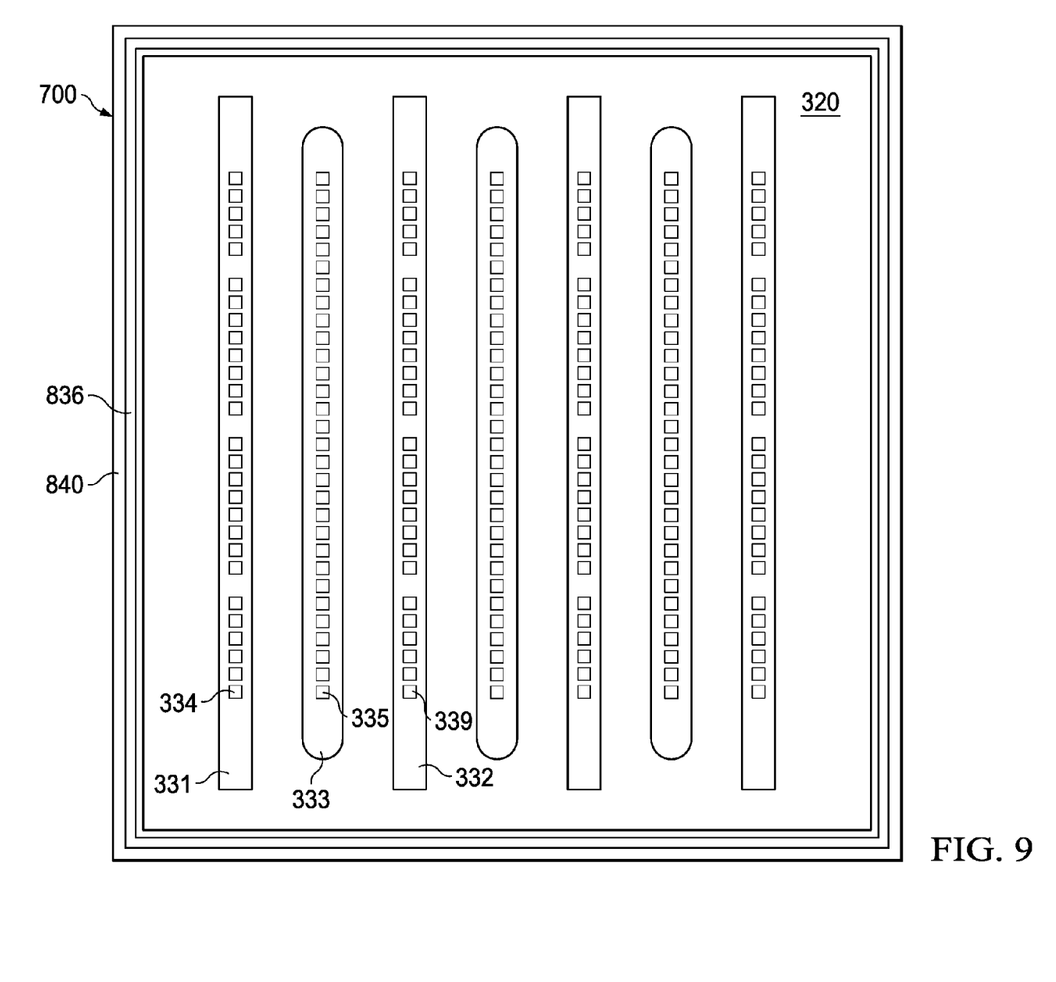

FIG. 9 is a top view of LIGBT 700 illustrating deep n ring 840 with p+ contact 836 which surrounds the multi-finger LIGBT device.

Figure 10:
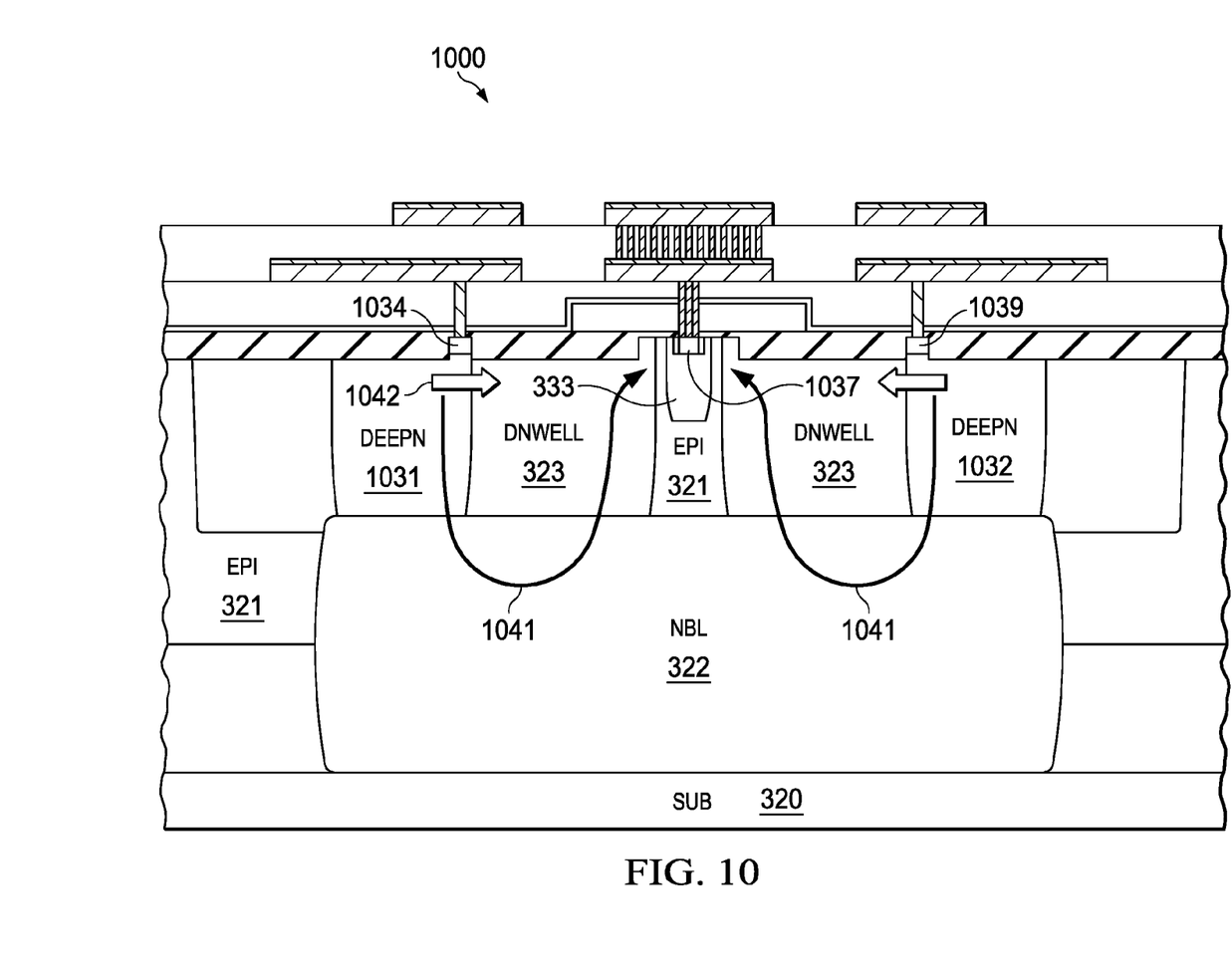
FIG. 10 is a cross sectional view of another embodiment of an LIGBT.

FIG. 10 is a cross sectional view of another embodiment of an LIGBT 1000. As mentioned earlier with regard to FIG. 5, added resistance 540 does not work for controlling SCR action with the integrated approach in which the second diode is formed in the deep n ring, as described with regard to FIG. 7. The drain extension region 323 is by necessity low doped to support voltage; therefore the pnp portion of an LIGBT with an integrated second diode may have a high gain and cause more scr formation.

In the embodiment of FIG. 10, the p+ anode is removed from the drain extension and placed in a heavily doped deep n-type region 1031, 1032 that goes down and joins deep n layer 321. The effective gain of the intrinsic pnp structure may be controlled by how much the deep n region overlaps the p+ region 1034, 1039, as indicated by arrow 1042. If it overlaps just a little bit, then there is only a small base region that results in a higher gain pnp structure. However, if the deep n region 1031, 1032 overlaps the p+ regions 1034, 1039 by a lot, then the effective gain of the intrinsic pnp structure is reduced and SCR action is thereby reduced and SOA is improved. For example, since the deep n-type region 1031 diffuses a lot, coincidence with p+1034 by using a same mask for both diffusions may provide a sufficient overlap. In an 0.18 um process, a 2 um overlap may be effective to prevent SCR action.

In this case, all of the anode current 1041 goes down to the nbl 321, and then gets collected by cathode 1037 in dwell 333. This can be done without reducing performance of LIGBT 1000 because the benefit of modulating the conductance of the drain extension region under control of the gate is still realized, which is what is limiting the current, but at the same time the tendency to turn on SCR action is reduced.

Figure 11:
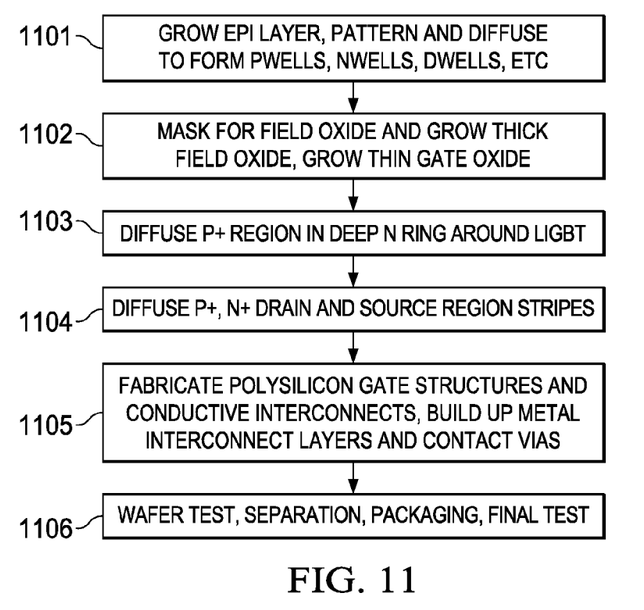
FIG. 11 is a flow chart illustrating a method for fabricating an LIGBT.

FIG. 11 is a flow chart illustrating a method for forming a second diode in an LIGBT transistor, such as LIGBT transistor 700 of FIGS. 7-9. As mentioned above, the general operation of LIGBT transistors is well known. Similarly, the semiconductor process for fabricating an LIGBT transistor is well known. Therefore, only the key fabrication steps based on this disclosure will be described in detail herein.

Initially, a semiconductor wafer is processed to form an epitaxial layer on top of the semiconductor wafer in step 1101. Nwell, pwell, and dwell regions are then patterned and diffused into the epi layer, as illustrated in FIG. 8, using known or later developed fabrication techniques.

A mask is then applied in step 1102 to form field oxide regions. An oxidation step is then performed to grow the thick field oxide in the drift regions and source regions as illustrated in FIG. 8. A thin gate oxide layer may then be grown over the wafer.

A p+ region, such as 836 in FIG. 8, may then be formed in step 1103 in a deep n well region such as 840, which surrounds the LIGBT device to form a second diode junction such as diode 711 of FIG. 7.

Additional diffusions may be performed in step 1104 to form the p+ and n+ drain and source region stripes described in more detail above with regards to FIGS. 8, 9.

Additional fabrication steps may then be performed in step 1105 to deposit a polysilicon layer and etch it to form the polysilicon gate structures, followed by one or more insulative layers and conductive layers that are patterned and etched to form interconnects, etc. Vias and contacts may be formed between the metal interconnects and the polysilicon gate structures.

After the semiconductor processing is completed, wafer testing is performed in step 1106, followed by a sawing operation to separate the die, packaging, and final testing of the integrated circuit.

SYSTEM EXAMPLE

Figure 12:
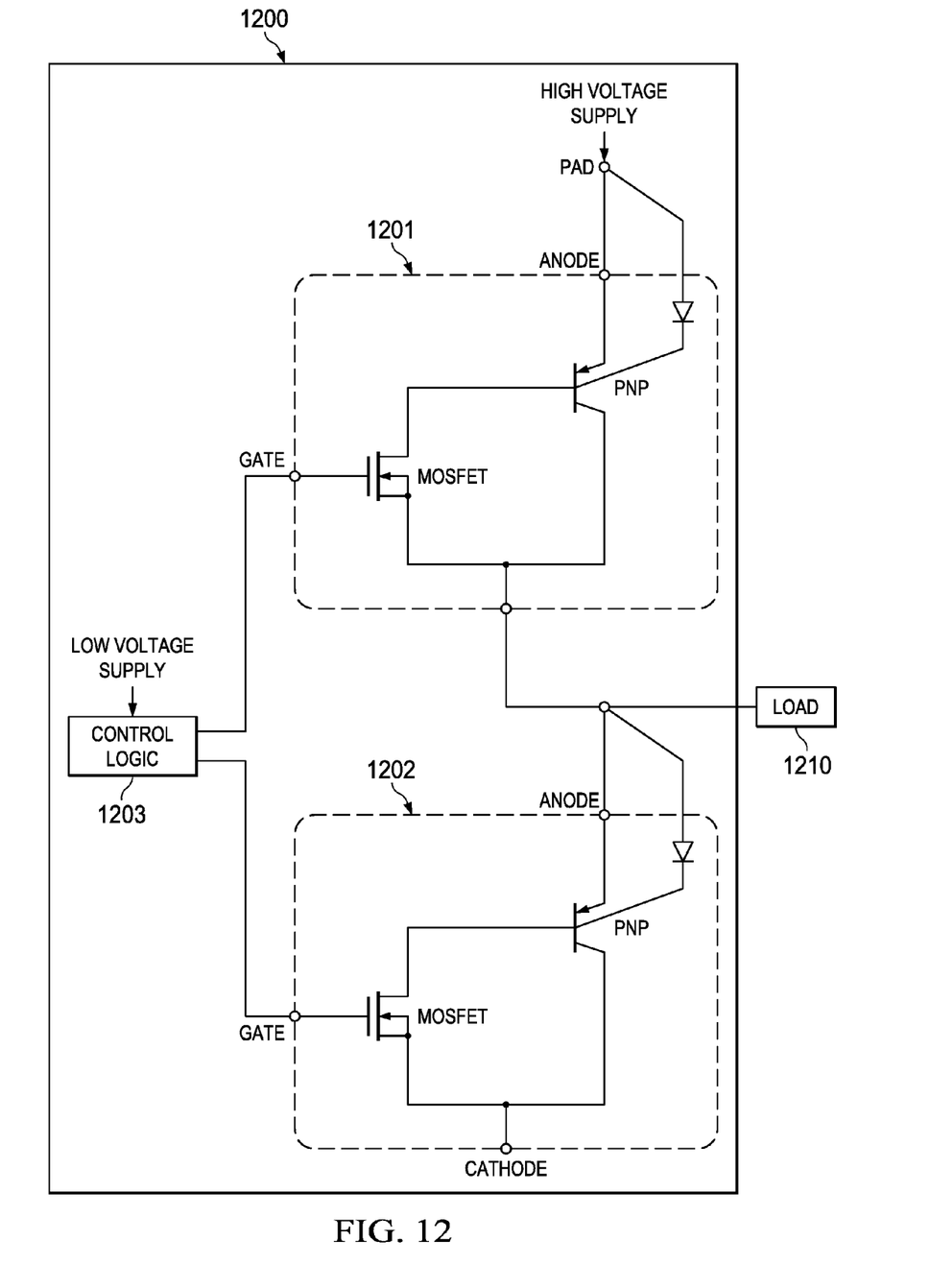
FIG. 12 is a block diagram of an integrated circuit that includes an LIGBT.

FIG. 12 is a block diagram of an example system with integrated circuit (IC) 1200 that includes an LIGBT device. In this example, two LIGBT devices 1201, 1202 are included, each of which may be similar to the LIGBT devices described with regard to FIGS. 1-10.

Control logic 1203 may also be included within IC 1200. Control logic may be tailored to perform a particular control task, or may be implemented as a processor core that may include memory for holding software and firmware instructions that may be executed by the processor to control the operation of LIGBT device 1201, 1202, for example. Additional interface logic, etc may be included within IC 1200.

Various types of systems may be implemented by connecting a load such as load device 1210 to be powered under control of IC 1200. Systems such as microwave and radio frequency (RF) power amplifiers may be implemented for example. Various types of industrial, residential, commercial, medical, etc. systems may be implemented using power transistors that are fabricated using the techniques disclosed herein to control motors, actuators, lights, etc.

OTHER EMBODIMENTS

While the disclosure has been described with reference to illustrative embodiments, this description is not intended to be construed in a limiting sense. Various other embodiments of the disclosure will be apparent to persons skilled in the art upon reference to this description. For example, while a LIGBT device was described herein, other embodiments may include other commonly known or later developed power transistors, such as planar IGBTs, trench IGBTs, discrete IGBTs, etc.

While a multi-finger power transistor was described herein, other embodiments may include a single finger power transistor. In some embodiments, there may only be a single drain stripe and a single source stripe.

While a linear transistor finger was described herein, in some embodiments, the finger topology may be other shapes than linear. For example, each finger may be configured as a circle, a square, a rectangle, u-shaped, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. A transistor, comprising:
   a semiconductor substrate;
   a first p+ region formed within an n-type region adjacent a p-type dwell region that together form a pnp structure within the semiconductor substrate, wherein an intrinsic diode is formed by the p+ region and the n-type region;
   a second n-type region formed within the p-type dwell region;
   an insulated conductive gate lying above the p-type dwell region configured to control a channel region in the p-type dwell region;
   a pad coupled to the first p+ region; and
   a second diode coupled between the pad and an n-type drift region in parallel with the intrinsic diode.

2. The transistor of claim 1, further including an n+ region formed in the n-type region, in which the second diode is connected to the n+ region.

3. The transistor of claim 1, in which the second diode is formed by a second p+ region formed within a deep n-type ring that surrounds the power transistor formed in the semiconductor substrate.

4. The transistor of claim 3, wherein the deep n-type ring overlaps a portion of the first p+ region, such that gain of the pnp structure is reduced.

5. The transistor of claim 1 in which the second diode is a discrete diode device formed in the semiconductor substrate.

6. The transistor of claim 1, further comprising a resistive device coupled in series with the interface pad and the first p+ region.

7. The transistor of claim 1 having at least one finger, in which the at least one finger has a linear topology.

8. The transistor of claim 1 being an insulated gate bipolar transistor (IGBT) and further including a third p+ region formed in the second n-type region;
   in which the first p+ region serves as an anode of the IGBT; and
   in which the third p+ region serves as a cathode of the IGBT.

* * * * *